(12) United States Patent
Ribeiro et al.

(10) Patent No.: US 8,780,610 B2
(45) Date of Patent: Jul. 15, 2014

(54) STORING DATA IN A NON-VOLATILE LATCH

(75) Inventors: Gilberto Medeiros Ribeiro, Palo Alto, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 104 days.

(21) Appl. No.: 13/560,058

(22) Filed: Jul. 27, 2012

(65) Prior Publication Data

US 2014/0029328 A1    Jan. 30, 2014

(51) Int. Cl.
*G11C 11/00* (2006.01)
*G11C 13/00* (2006.01)

(52) U.S. Cl.
CPC .................. *G11C 13/0069* (2013.01)
USPC ....... 365/148; 365/158; 365/129; 365/230.06

(58) Field of Classification Search
CPC ........... G11C 2213/71; G11C 2213/31; G11C 2213/72; G11C 13/0069
USPC .............................. 365/148, 158, 129, 230.06
See application file for complete search history.

(56) References Cited

U.S. PATENT DOCUMENTS

| 7,471,554 B2 | 12/2008 | Spall et al. |
| 2011/0267870 A1* | 11/2011 | Fiorentino et al. ............ 365/148 |
| 2012/0014169 A1 | 1/2012 | Snider et al. |

OTHER PUBLICATIONS

Chiu, P.-F. et al., Low Store Energy, Low VDDmin, 8T2R Nonvolatile Latch and SRAM with Vertical-stacked Resistive Memory (memristor) Devices for Low Power Mobile Applications, (Research Paper), IEEE Journal of Solid-State Circuits, Jun. 2012, pp.
Eshraghian, K. et al., Memristor MOS Content Addressable Memory (MCAM): Hybrid Architecture for Future High Performance Search Engines, IEEE Transactions on Nov. 5, 2010.
Jung, C-M. et al., Zero-sleep-leakage Flip-flop Circuit with Conditional-storing Memristor Retention Latch, (Research Paper), IEEE Transactions on Nanotechnology, Mar. 2012.
Shen, W.C. et al., Memristor Logic Operation Gate with Share Contact RRAM Cell, (Research Paper), IEEE Electron Device Letters, Dec. 2011, pp. 1650-1652, vol. 32, No. 12.

* cited by examiner

*Primary Examiner* — Thong Q Le

(57) ABSTRACT

Storing data in a non-volatile latch may include applying a bias voltage to a memristor pair in electrical communication with at least one logic gate and applying a gate voltage to a transmission gate to allow an input voltage to be applied to the at least one logic gate where the input voltage is greater than the bias voltage and the input voltage determines a resistance state of the memristor pair.

20 Claims, 4 Drawing Sheets

STORING DATA IN A NON-VOLATILE LATCH

BACKGROUND

Many computer products use random access memory (RAM) and non-volatile memory (NVM). Generally, RAM operates quicker than the NVM, but requires a continuous power source to prevent the information in RAM from being erased. NVM, on the other hand, retains its memory during power losses and is generally used as a permanent memory storage.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

Memory circuits may include multiple transistors built with complementary metal oxide semiconductor (CMOS) technology. For example, a unidirectional cell in a shift register often includes fourteen CMOS transistors that need a continuous power source to prevent data loss. For bidirectional cells, additional logic may be needed. Also, in the event of a power loss, the shift register loses its data. As a consequence, devices utilizing a shift register constantly supply power even while the shift register is idle. Such idling power over many cells of multiple shift registers adds up to significant power consumption.

Memristors are bistable circuit elements that normally work at the nanometer scale. A memristors often exhibits an ability to change its resistance as electrical voltage or current is applied to it. However, once the voltage or current is discontinued, the memristor's material maintains or "remembers" the resistance change. As a consequence, the memristors are non-volatile devices with an ability to store binary information. Such memristors have smaller footprints than the CMOS transistors.

The principles described herein incorporate memristors into memory devices, like shift registers, latches, flip-flops, other memory devices, or combinations thereof to reduce the device's size and retain information in the event of a power loss. Such devices may be less expensive and may consume less power. In fact, in some examples, such devices purposefully reduce or eliminate idling power by forcing the device into a sleep mode to discontinue supplying power to its internal cells, like those of a shift register. The principles described herein may also be used for devices that operate in conditions that intermittently lose power or signals, such as remote devices.

Storing data in non-volatile circuitry may include applying a bias voltage to a memristor pair in electrical communication with a logic gate and applying a gate voltage to a transmission gate to allow an input voltage to be applied to the logic gate where the input voltage is greater than the bias voltage and the input voltage determines resistance states in the memristor pair.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
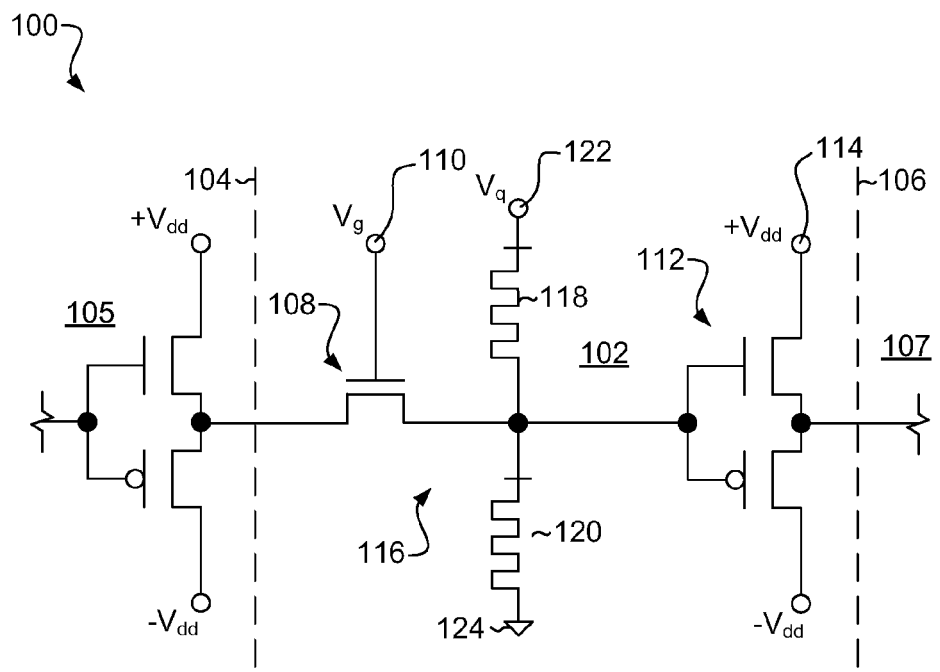
FIG. 1 is a diagram of illustrative circuitry, according to principles described herein.

FIG. 1 is a diagram of illustrative circuitry (100), according to principles described herein. In this example, the circuitry (100) includes a cell (102) of a memory device. The cell (102) may be a latch, a repeatable configuration of a shift register, a repeatable configuration of a flip flop, other portions of circuitry, or combinations thereof. Boundaries of the cell (102) are denoted with dashed lines (104, 106). The cell (102) receives an input voltage from an incoming cell (105) and outputs an output voltage to an outgoing cell (107).

The cell (102) may include a transmission gate (108) that allows and disallows an input voltage to enter the cell (102) or the cell (102) may include a pass transistor for operation with positive polarity power sources. The transmission gate (108) may be made of transistors and may be electrically connected to a transmission gate voltage source (110). In some examples, a high voltage signal is applied to the transmission gate (108) to allow an input signal to pass into the cell (102). In some examples, the transmission gate (108) is an enable line or circuit elements that impose a clock pulse to open the transmission gate (108). The transmission gate (108) may include a semiconductor material that is electrically conductive when exposed to an electric field of a sufficient strength. In the absence of such a field, the semiconductor material may have a high resistance and inhibit the input voltage from entering the cell (102). When the transmission gate voltage source (110) applies a high voltage to the transmission gate (108), an electric field of sufficient strength may be generated such that the transmission gate becomes electrically conductive allowing an input voltage from the incoming cell (105) to enter into the cell (102).

The input voltage may be a signal with either a high voltage or a low voltage. A logic gate (112) may also be in the cell (102), and the logic gate (112) may perform a logic operation with the input voltage. In the example of FIG. 1, the logic gate (112) is an inverter that inverts incoming signals. For example, if the transmission gate (108) allows a high input voltage, the inverter will output a low voltage to the outgoing cell (107) and vice versa. The logic gate (112) may be supplied with its own logic voltage source (114) for performing the logic operation. The inverter may be used to condition signals, such as leveling signals or buffering signals. While the illustrated example includes an inverter, other logic gates may be used. A non-exhaustive list of logic gates that may be used with the principles described herein include, NOT gates, NOR gates, AND gates, NAND gates, OR gates, MAJ gates, 2-in 1-out gates, adder gates, other gates, or combinations thereof. In some examples, the logic gates are used to create unidirectional and/or bidirectional cells.

In the example of FIG. 1, a memristor pair (116) is located between the transmission gate (108) and the logic gate (112). The memristor pair (116) may include first memristor (118) and a second memristor (120) connected in series to one another. The first memristor (118) may be electrically connected to a bias voltage source (122) and the second memristor (120) may be electrically connected to a ground reference (124).

Each of the first and second memristors (118, 120) may have either a high resistance state or a low resistance state. In some examples, as a signal passes through a memristor with a high resistance state, the signal's voltage is dropped. On the other hand, in some examples, as a signal passes through a memristor with a low resistance state, the signal is allowed to pass through without a substantial affect from the memristor on that signal. The resistance state of a memristor may be changed by applying an appropriate voltage across that memristor. For example, a positive voltage with a value over a first switching threshold may switch the resistance state of the memristor to a low resistance state. On the other hand, a negative voltage with a value below a second switching threshold may switch the resistance state to a high resistance state. In some examples, any voltage passed through the memristor with a value between the first and second threshold will not switch the resistance state of the memristor. In some examples, the voltage range between the first and the second switching thresholds is controlled during the manufacturing processes by using specific memristor materials. In some examples, the on/off switching ratios of the memristors are in the order of a thousand. However, in some examples, the on/off ratio is significantly lower, such as a ratio of approximately four. Any on/off ratio compatible with the principles described herein may be used.

The memristor pair may be arranged so that the first and second memristors (118, 120) have opposite resistance states. For example, if the first memristor (118) has a high resistance state, then the second memristor (120) has a low resistance state. Such an arrangement may be accomplished by causing the memristor materials to be electrically connected to the circuit in opposite orientations. In some examples, the memristor pair may be arranged so that the first and second memristors (118, 120) have opposite polarity and by construction will inevitably exhibit opposite resistance states.

In some examples, high input voltages exceed the first switching threshold of the first memristor (118). In such an example, the same high input voltage may also be below the second switching threshold for the second memristor (120) in examples where the second memristor (120) is orientated in an opposite orientation of the first memristor (118). In such a situation, the high input voltage may cause the first memristor (118) to have a low resistance state while simultaneously causing the second memristor (120) to have a high resistance state. Conversely, a low input voltage may be below the second switching threshold of the first memristor (118) and above the first switching threshold of the second memristor (120). As a consequence, the low input voltage may cause the first memristor (118) to have a high resistance state and the second memristor (120) to have a low resistance state. In some examples, the first and second memristors (118, 120) always have opposite state by construction.

In some examples, the switching thresholds are affected by the relatively potential of the ground reference (124). In some examples, the first switching threshold is exceeded with current flowing in a first direction, while the second switching threshold is exceeded with current flowing in a second direction. Thus, by changing the relatively potential of the ground reference (124), the direction in which the current flows through the memristor pair (116) may be affected.

A bias voltage may be applied to the memristor pair (116) with the bias voltage source (122). The bias voltage may be between the first and the second switching thresholds, and as a result, the bias voltage will not change the resistance states of either of the first or second memristors (118, 120).

In the event of a power loss, the bias voltage, the input voltage, the gate voltage, and the logic voltage may be discontinued. In such an event, the information stored in the logic gate is lost. However, the power loss will not affect the resistance states of either of the first or the second memristor (118, 120) of the memristor pair (116).

In response to regaining power, a processor may follow a restore procedure to ensure that correct information is rewritten into the logic gate (112) of the cell (102). In some examples, the procedure temporarily disables the transmission gate (108) to ensure that incoming input voltages do not affect the resistance states in the first and second memristors (118, 120). Next, a bias voltage may be applied to the memristor pair (116) and, as a consequence, to the logic gate (112). The bias voltage may have a value between the first and second switching thresholds, and as a consequence, the bias voltage may apply a voltage to the logic gate (112) through the memristor pair (116) without changing resistance states. Since the memristors' resistance states reflect the last input voltage sent through the cell (102), the resulting voltage on the logic gate reflects the lost information.

In some examples, the resulting voltage on the logic gate (112) during the restore procedure is substantially equal to $V_q(R_2/(R_1+R_2))$, where $V_q$ represents the bias voltage, $R_1$ represents a first resistance of the first memristor, and $R_2$ represents a second resistance of the second memristor. $V_q$ may be of the order of 100 millivolts to 0.5 volts. In some examples, the $V_q$ is small enough to properly amplify by the inverter after the lost information is rewritten back into the logic gate (112), the transmission gate (108) may be enabled and the circuitry (100) may function under normal operating conditions.

In some examples, the bias voltage is adjustable to control the speed at which the binary information stored in the memristor (116) is copied to the logic gate (112). In some examples, the higher the bias voltage, the faster that the information is copied, and the lower the bias voltage, the slower that the information is copied. However, the bias voltage may stay within the switching thresholds to prevent switching the resistance states of the first and second memristors so that the correct information is copied to the logic gate. In some examples, in the event of regaining power, the bias voltages are increased, while keeping the bias voltage within the switching thresholds, to decrease the latency associated with copying the information to the logic gates (112). After copying has occurred, the bias voltages may be returned to its previous levels.

To hold the information in the logic gate (112), the logic gate voltage is applied to the logic gate to cause the logic gate (112) to perform its operation. However, the logic gate voltage should also be held between the switching thresholds of the memristors in the memristor pair to prevent affecting their resistance states.

In some examples, the information in the cell (102) is read by outputting a voltage signal or propagating the signal through a sequence of cells. In other examples, the binary information in the cell (102) is read by measuring the electrical current from the bias voltage line. In some examples, the voltage sources, including the bias voltage source, are turned off during idling to preserve power. However, in such an example, the power to just the bias line may be restored for the purpose of reading the binary information. As a consequence, the circuitry (100) may expend less power to read the information bit in the cell (102) when reading than consuming during writing. Further, the cell (102) may conserve energy during all activities other than writing and/or shifting the information bit to another cell.

Figure 2:
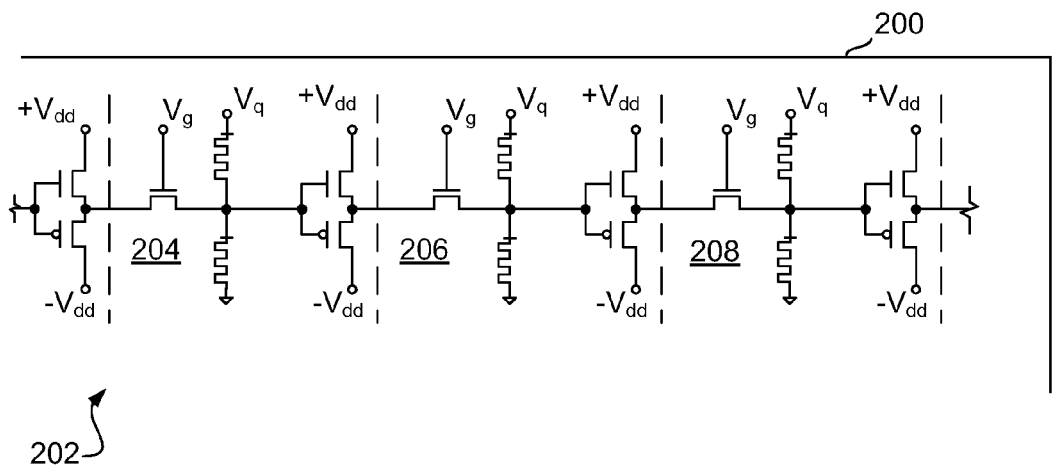
FIG. 2 is a diagram of an illustrative device with a shift register, according to principles described herein.

FIG. 2 is a diagram of an illustrative device (200) with a shift register (202), according to principles described herein. In this example, the shift register (202) has multiple cells (204, 206, 208) that incorporate memristor pairs, transmission gates, and logic gates. Each cell (204, 206, 208) may store a bit of information. This information may be written directly into the cell or the information may have been shifted into the cells from an adjacent cell in the shift register (202).

The principles described herein may be applied to any shift register. A non-exhaustive list of shift registers that may be compatible with the principles described herein include serial-in/serial-out registers, a parallel-in/serial out shift registers, serial-in/parallel out shift registers, parallel-in/parallel out shift registers, universal shift registers, other shift registers, or combinations thereof. In some examples, the principles described herein are applied to other circuitry that stores binary information. A non-exhaustive list of other circuits that may be compatible with the principles described herein include latches, set-reset latches, gated set-reset latches, D-latches, edge triggered latches, flip-flops, J-K flip-flops, asynchronous flip-flops, ring counters, other circuits, or combinations thereof.

The device may be any device that stores memory. A non-exhaustive list of devices that may be compatible with the principles described herein includes field programmable gate arrays, computers, laptops, electronic tablets, decorders, encoders, printers, copiers, phones, watches, mobile devices, instrumentation, automobiles, multiplexers, electronic machinery, tools, navigation systems, satellites, processing devices, controllers, registers, caches, processors, other devices that store memory, or combinations thereof.

Each cell of the shift register (202) may include a total of four transistors and two memristors. The transmission gates (210) may include two transistors and the inverters (212) may also include another two transistors. Further, the memristor pairs (216) may include the two memristors. In some examples, commercially available shift registers use fourteen transistors each and need a continuous supply of power to prevent data loss. As a consequence, the shift register in the example of FIG. 2 is smaller and has the advantage of remembering its stored information during power losses.

The transmission gates of each of the cells (204, 206, 208) may be coordinated so that a single input voltage value is not applied simultaneously to multiple cells. For example, a timing circuit or a timing controller may cause the transmission gates of adjacent cells (204, 208) to close while the transmission gate of cell (206) opens. In this manner, cell (206) may receive the input voltage from cell (204) while cell (204) is prevented from receiving another input signal that may change the signal entering cell (206). Further, the input voltage received into cell (204) will not transfer into cell (208) and affect its binary information. In such a manner, a single bit of information may be passed from one cell of a shift register to another cell without inference. In some examples, a transmission gate controller causes the transmission gates of every other cell to be open while the remaining transmission gates are closed and vice versa. Thus, the transmission gates of adjacent cells may be alternated on and off to propagate a single bit of information through the shift register. In other examples, the transmission gate controller causes the transmission gates to open and close in another appropriate sequence, such as by staggering the opening and closing of the transmission gates.

Figure 3:
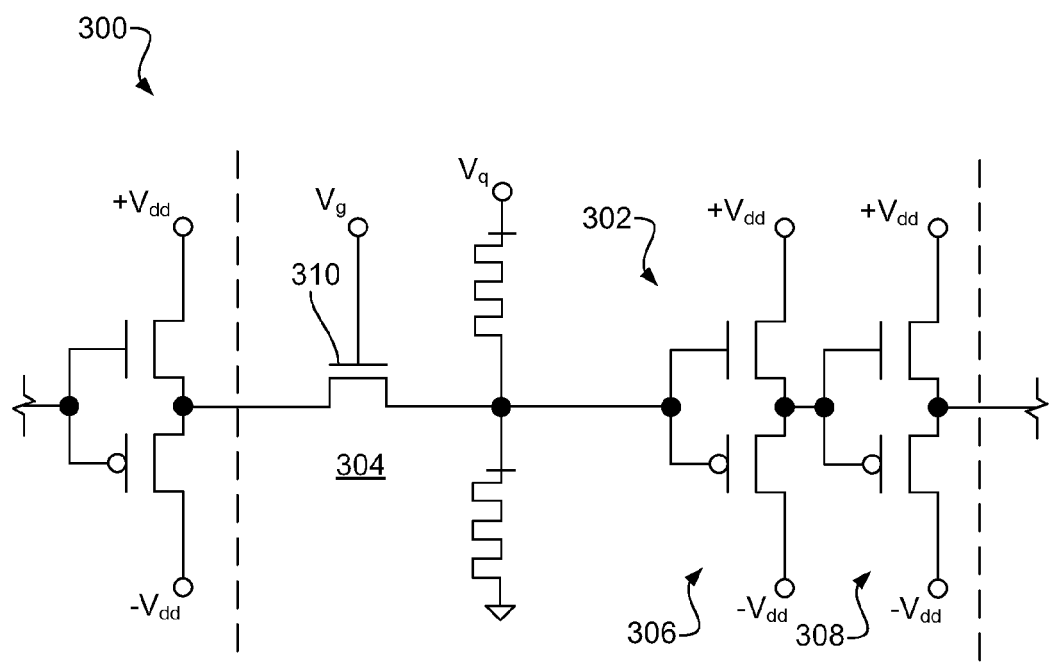
FIG. 3 is a diagram of illustrative circuitry, according to principles described herein.

FIG. 3 is a diagram of illustrative circuitry (300), according to principles described herein. In this example, the logic gate (302) of the cell (304) has a first inverter (306) and a second inverter (308). As a consequence, an input voltage allowed to pass through the transmission gate (310) may be inverted twice resulting in the output voltage being the same as the input voltage. Such a cell (304) may be used as a buffer or a place holder in a more complex circuit. In some examples, the inverters (306, 308) or other logic gates amplify signals from the input voltage to the output voltage.

Figure 4:
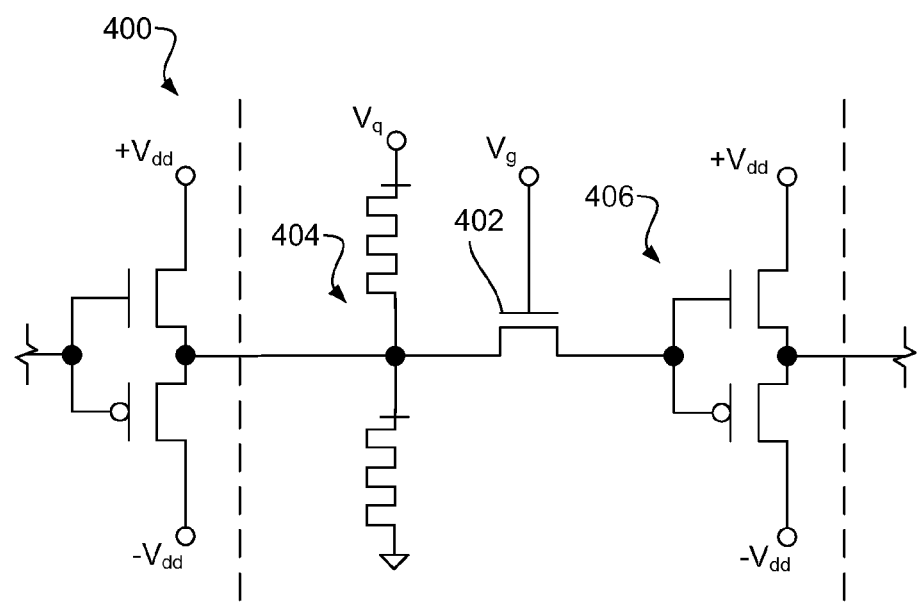
FIG. 4 is a diagram of illustrative circuitry, according to principles described herein.

FIG. 4 is a diagram of illustrative circuitry (400), according to principles described herein. In this example, the transmission gate (402) is positioned between the memristor pair (404) and the logic gate (406). As a consequence, the memristor pair (404) records the input voltage irrespective of the transmission gate's electrical conductivity.

Figure 5:
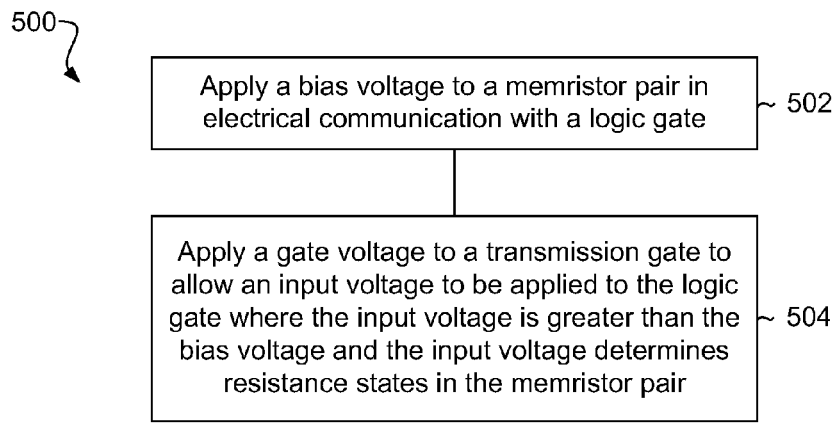
FIG. 5 is a diagram of an illustrative method for storing data, according to principles described herein.

FIG. 5 is a diagram of an illustrative method (500) for storing data, according to principles described herein. In this example, the method (500) includes applying (502) a bias voltage to a memristor pair in electrical communication with a logic gate and applying (504) a gate voltage to a transmission gate to allow an input voltage to be applied to the logic gate where the input voltage is greater than the bias voltage and the input voltage determines resistance states in the memristor pair.

In some examples, a first memristor of the memristor pair is arranged to have an opposite resistance state of a second memristor in the memristor pair. Such an arrangement may be accomplished by orientating the first and the second memristors in opposing directions such that a single input voltage into the cell will cause each of the first and second memristors to have opposite resistance states.

In the absence of a voltage input, such as in situations where a low voltage or no voltage is applied to the transmission gate, the bias voltage may cause a resulting voltage to be felt at the logic gate. For example, the resulting voltage may be approximately equal to $V_q(R_2/(R_1+R_2))$, where $V_q$ represents the bias voltage, $R_1$ represents a first resistance of the first memristor, and $R_2$ represents a second resistance of the second memristor. Applying a bias voltage to create the resulting voltage may provide the advantage of copying the information stored in the memristor pair to the logic gate. For example, if the cell has recently regained power from a power loss, the application of the bias voltage may cause the binary information stored in the memristor pair to be copied to the logic gate.

In some examples, the memristor pair is positioned between the transmission gate and the logic gate. In alternative examples, the transmission gate is positioned between the memristor pair and the logic gate. The logic gate may be any circuitry that performs a logic function. In some examples, the logic gate is a single inverter that inverters the input voltage. In alternative examples, the logic has two inverters that are arranged to output an output voltage that has at least a similar value to the input voltage. In some examples, the logic gate and/or inverters amplify the input voltage's signal.

Figure 6:
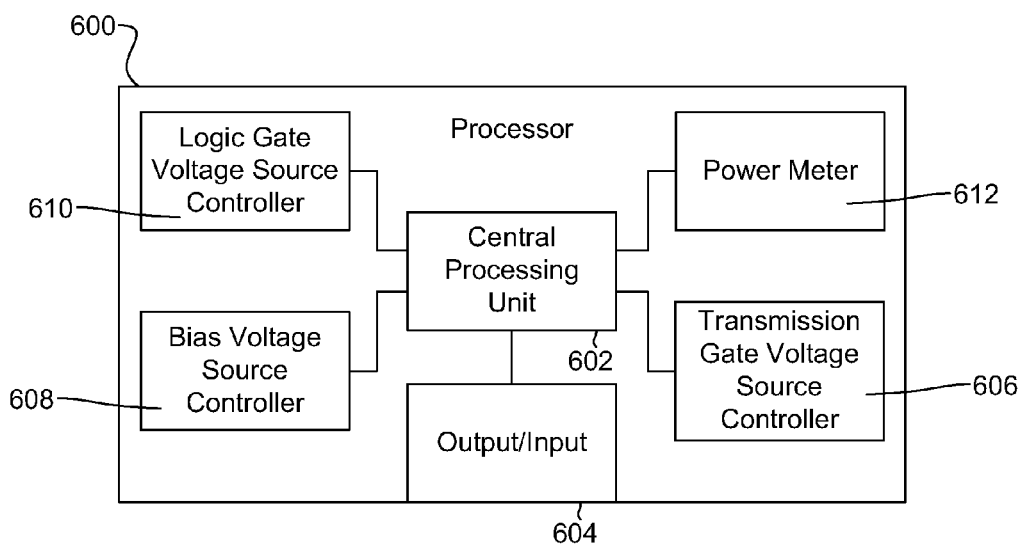
FIG. 6 is a diagram of an illustrative processor, according to principles described herein.

FIG. 6 is a diagram of an illustrative processor (600), according to principles described herein. In this example, the processor (600) has a central processing unit (CPU) (602) that is in communication with an output/input (604). The output/input (604) may be in communication with the voltage sources of the cell. For example, the output/input (604) may be in communication with a transmission gate voltage source, a bias voltage source, a logic gate voltage source, another voltage source, or combinations thereof.

The CPU (602) may have voltage source controllers (606, 608, 610) that control the respective voltage sources. For example, a transmission gate voltage source controller (606) may control the transmission gate voltage source, a bias voltage source controller (608) may control the bias voltage source, and a logic gate voltage source controller (610) may control the logic gate voltage source.

In some examples, the processor (600) includes a power meter (612) for at least one of the voltage sources. In some examples, the processor (600) includes a power meter for each of the voltage sources to determine when a power loss has occurred and to determine when power is regained. In response to a power loss, the power meter (612) may send a signal to the CPU (602) to watch for a power restoration. As a consequence, when power is regained, the CPU (602) may execute a procedure to ensure that the binary information stored in the memristor pair is written to the logic gate. In such an example, the procedure may include using the transmission gate voltage source controller (606) to prevent input voltages from entering the cell. The procedure may then include applying both a bias voltage and a logic gate voltage with their respective controllers (608, 610) to cause the binary information stored in the memristor pair to be copied to the logic gate.

In other examples, the power meter just sends signals to the CPU (602) to indicate that power has been restored. In response to receiving a power restore message, the processor may initiate the procedure to write the information from the memristor pairs to the logic gates. In some examples, the procedure includes disabling all of the transmission gates in the circuitry when the circuitry has more than one cell, such as in examples where the circuitry includes a shift register. While all of the transmission gates are disabled, the procedure may include applying the appropriate bias voltages and logic gate voltages to copy the information in the memristor pairs to the logic gates.

Figure 7:
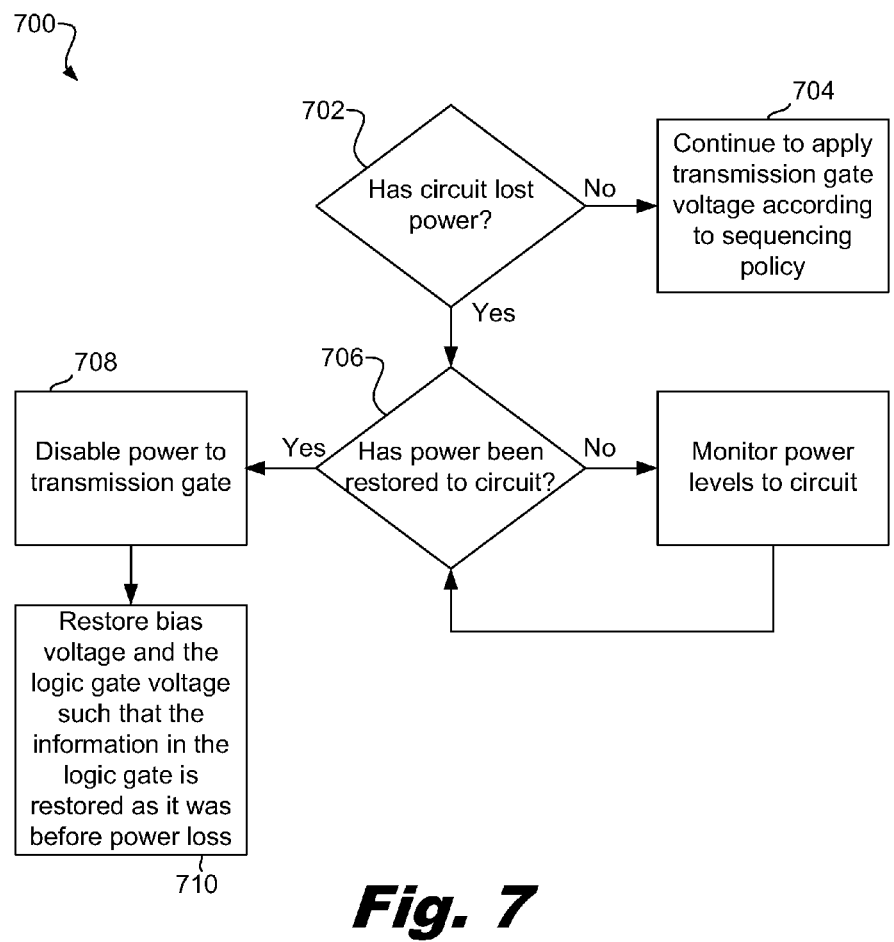
FIG. 7 is a diagram of an illustrative flowchart of a process for storing data, according to principles described herein.

FIG. 7 is a diagram of an illustrative flowchart (700) of a process for storing data, according to principles described herein. In this example, the process includes determining (702) whether the circuit has power. If the circuit has not lost power, the process may include continuing (704) to apply transmission gate voltages according to a sequencing policy that coordinates which cells are open to receive input voltages and which cells are closed. Such timing may prevent the information intended to be written in one cell from affecting the information stored in an adjacent or subsequent cell.

If the process indicates that the circuit has lost power, then the process may include determining (706) whether power has been restored to the circuit. If no power has been restored to the circuit, then the process may include monitoring the powers levels to the circuit to determine when power has been restored. If the power has been restored to the circuit, then the process may include disabling (708) power to the transmission gates. The process may also include restoring (710) the bias voltage to the memristor pairs and restoring the logic gate voltage to the logic gate such that the information in the logic gate is restored as it was before the power was lost.

While the examples above have been described with reference to particular circuitry arrangements, any arrangement compatible with the principles described herein may be used. Further, while the transmission gates and the logic gates have been described above with reference to particular configurations any transmission gate configurations or logic gate configurations may be used. In some examples, the circuitry described above is implemented in a cross bar array. In some examples, portions of the circuitry are implemented in different layers of a cross bar array stack. For example, the transistors in the above examples may be implemented in a bottom layer of a cross bar array stack and be implemented with CMOS technology, while the memristor pairs are implemented in a higher layer of the stack. In some examples, the memristor pairs are implemented vertically above the transistors made with CMOS technology.

While the examples above have been described with reference to specific voltage potentials and switching ratios, any voltage potentials and switching ratios compatible with the principles described herein may be used. Further, while the examples above have been described with reference to specific procedures and processes for copying the information stored in the memristor pair to the logic gate after power has been restored, any procedure or process that is compatible with the principles described herein may be used.

The memristors may have switching characteristics that exhibit non-linear or linear current/voltage relationships. In some examples, the memristor material includes niobium, titanium, tungsten, manganese, iron, vanadium, indium, silicon, tantalum, hafnium, nickel, aluminum, zirconium, molybdenum, copper, chromium, silver, oxides thereof, nitrides thereof, carbides thereof, phosphides thereof, sulfides thereof, doped alloys thereof, single element metals, semiconductors, or combinations thereof.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A non-volatile memory circuit, comprising:
    a memristor pair in electrical communication with a logic gate;
    a bias voltage source in communication with said memristor pair; and
    a transmission gate positioned to permit an input signal to pass to said logic gate.

2. The circuit of claim 1, wherein said circuit is a latch, a flip flop, a shift register, or combinations thereof.

3. The circuit of claim 1, wherein said logic gate comprises at least one inverter.

4. The circuit of claim 1, wherein a memristor of said memristor pair is electrically connected to ground reference.

5. The circuit of claim 1, wherein said memristor pair is connected in series between said bias voltage source and ground.

6. The circuit of claim 1, wherein said transmission gate comprises a gate and, upon application of a gate voltage to said gate, allows said input signal to pass to said logic gate.

7. The circuit of claim 1, wherein said memristor pair is disposed between said transmission gate and said logic gate.

8. The circuit of claim 7, wherein:
    said transmission gate is connected to pass said input signal to a node between memristors of said memristor pair; and
    said logic gate is connected to said node and conditions and then outputs said input signal.

9. The circuit of claim 1, wherein said transmission gate comprises a transistor.

10. A method of storing data in a non-volatile latch, comprising:
    applying a bias voltage to a memristor pair in electrical communication with a at least one logic gate; and
    applying a gate voltage to a transmission gate to allow an input voltage to be applied to said at least one logic gate where said input voltage is greater than said bias voltage and said input voltage determines resistance states in said memristor pair.

11. The method of claim 10, wherein said memristor pair is positioned between said transmission gate and said at least one logic gate.

12. The method of claim 10, wherein said at least one logic gate comprises at least one inverter.

13. The method of claim 10, wherein a first memristor of said memristor pair is arranged to have an opposite resistance state of a second memristor in said memristor pair.

14. The method of claim 13, wherein said bias voltage causes a resulting voltage to be applied to said at least one logic gate in an absence of said input voltage that is substantially equal to $V_q(R_2/(R_1+R_2))$, where $V_q$ represents said bias voltage, $R_1$ represents a first resistance of said first memristor, and $R_2$ represents a second resistance of said second memristor.

15. A device for storing data, comprising:
a memristor pair in electrical communication with a logic gate;
a bias voltage source in communication with said memristor pair;
a transmission gate positioned to permit an input signal to pass to said logic gate;
a processor programmed to
disable said transmission gate in response to regaining power from a power failure;
and restore a bias voltage to said memristor pair such that data lost from said logic gate is restored.

16. The device of claim 15, wherein said logic gate comprises two inverters electrically connected in series.

17. The device of claim 15, wherein said bias voltage is less than a threshold voltage to change a resistance state of a memristor in said memristor pair.

18. The device of claim 15, wherein a first memristor of said memristor pair is arranged to have an opposite resistance state of a second memristor in said memristor pair.

19. The device of claim 18, wherein said memristor pair is positioned such that said bias voltage causes a resulting voltage to be applied to said logic gate in an absence of said input voltage that is substantially equal to $V_q(R_2/(R_1+R_2))$, where $V_q$ represents said bias voltage, $R_1$ represents a first resistance of said first memristor, and $R_2$ represents a second resistance said second memristor.

20. The device of claim 15, wherein said transmission gate is positioned between said memristor pair and said logic gate.

* * * * *